US010825884B2

(12) United States Patent
Liu

(10) Patent No.: US 10,825,884 B2
(45) Date of Patent: Nov. 3, 2020

(54) DISPLAY PANEL AND DISPLAY DEVICE HAVING ANODE NOT OVERLAPPING WITH GATE LINES AND/OR LIGHT-EMITTING CONTROL SIGNAL LINES

(71) Applicant: SHANGHAI TIANMA AM-OLED CO., LTD., Shanghai (CN)

(72) Inventor: Liyuan Liu, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 8 days.

(21) Appl. No.: 16/257,005

(22) Filed: Jan. 24, 2019

(65) Prior Publication Data

US 2019/0172895 A1    Jun. 6, 2019

(30) Foreign Application Priority Data

Aug. 3, 2018  (CN) .......................... 2018 1 0880087

(51) Int. Cl.
*H01L 27/32*   (2006.01)
*H01L 51/52*   (2006.01)
(Continued)

(52) U.S. Cl.
CPC ....... *H01L 27/3276* (2013.01); *G09G 3/2003* (2013.01); *G09G 3/3275* (2013.01);
(Continued)

(58) Field of Classification Search
CPC ............. H01L 27/3276; H01L 51/5209; H01L 27/3211; G09G 3/2003; G09G 3/3275
See application file for complete search history.

(56) References Cited

U.S. PATENT DOCUMENTS 9,245,932 B2 *   1/2016   Yoon ................... H01L 27/3216

FOREIGN PATENT DOCUMENTS

CN           1971388 A        5/2007
CN         101577248 A       11/2009
(Continued)

OTHER PUBLICATIONS

Office Action of Chinese Patent Application No. 201810880092.5 dated Dec. 10, 2019.
(Continued)

*Primary Examiner* — Joseph L Williams
(74) *Attorney, Agent, or Firm* — Kilpatrick Townsend & Stockton, LLP

(57) ABSTRACT

A display panel and a display device are provided. The display panel includes a base substrate; a plurality of gate lines extending in a row direction and a plurality of data lines extending in a column direction arranged on the base substrate, and the plurality of gate lines and the plurality of data lines intersect in an insulation manner to define a plurality of pixel circuit regions including a plurality of pixel circuits; a plurality of sub-pixel regions arranged on the base substrate, and each of the plurality of sub-pixel regions includes a light-emitting element, a corresponding one of the plurality of pixel circuits provides a driving signal to the light-emitting element, and the light-emitting element includes an anode, a light-emitting layer and a cathode which are sequentially stacked at a side of the base substrate; and a plurality of light-emitting control signal lines arranged on the base substrate.

19 Claims, 9 Drawing Sheets

(51) Int. Cl.
*G09G 3/3275* (2016.01)
*G09G 3/20* (2006.01)
G09G 3/3208 (2016.01)

(52) U.S. Cl.
CPC ...... *H01L 27/3211* (2013.01); *H01L 51/5209* (2013.01); *G09G 3/3208* (2013.01); *G09G 2300/0426* (2013.01); *G09G 2300/0452* (2013.01)

(56) References Cited

FOREIGN PATENT DOCUMENTS

| CN | 106920814 A | 7/2017 |
| CN | 107422547 A | 12/2017 |

OTHER PUBLICATIONS

Office Action of Chinese Patent Application No. 201810880087.4 dated Apr. 2, 2020.

\* cited by examiner

DISPLAY PANEL AND DISPLAY DEVICE HAVING ANODE NOT OVERLAPPING WITH GATE LINES AND/OR LIGHT-EMITTING CONTROL SIGNAL LINES

CROSS-REFERENCE TO RELATED APPLICATIONS

The present disclosure claims priority to Chinese Patent Application No. 201810880087.4, filed on Aug. 3, 2018, the content of which is incorporated herein by reference in its entirety.

FIELD

The present disclosure relates to the field of display technologies, and particularly, to a display panel and a display device.

BACKGROUND

Compared with various display panels, an OLED (Organic Light-Emitting Diode) display panel has many advantages such as self-luminous, high contrast, and no limitation on viewing angle. The OLED display panel is not only lighter and thinner in volume, but also is lower in power consumption than other display devices, thereby contributing to improving the cruising ability of the display device. Therefore, the OLED display panel is widely used in the field of display technologies, and will become a mainstream product of the display device in future.

At present, a common OLED display panel includes an organic light-emitting element emitting red light, an organic light-emitting element emitting green light, and an organic light-emitting element emitting blue light. In a production process, in consideration of saving cost and saving preparation steps, the same mask is used to simultaneously evaporate the three light-emitting elements emitting lights of different colors, so that there is at least one common film layer in the three light-emitting elements emitting lights of different colors.

However, since the three light-emitting elements emitting lights of different colors have different threshold voltages, when a light-emitting element having a large threshold voltage is turned on, current carriers are moved laterally through the common film layer, causing the remaining light-emitting elements emitting the light of different colors, which are not turned on yet, to emit light under a condition that light-emitting is undesired. Therefore, not only power consumption is increased, but also display effect is adversely affected.

Therefore, in order to reduce power consumption and improve display effect, there are still some problems such as how to avoid the problem of undesired light-emitting among the light-emitting elements emitting lights of different colors in the OLED display panel.

SUMMARY

In view of this, the present disclosure provides a display panel and a display device which can prevent undesired light emission between light-emitting elements having different colors in an OLED display panel.

In one embodiment of the present disclosure, a display panel is provided. The display panel includes a base substrate; a plurality of gate lines extending in a row direction and a plurality of data lines extending in a column direction arranged on the base substrate, and the plurality of gate lines and the plurality of data lines intersect in an insulation manner to define a plurality of pixel circuit regions including a plurality of pixel circuits; a plurality of sub-pixel regions arranged on the base substrate, and each of the plurality of sub-pixel regions includes a light-emitting element, a corresponding one of the plurality of pixel circuits provides a driving signal to the light-emitting element, and the light-emitting element includes an anode, a light-emitting layer and a cathode which are sequentially stacked at a side of the base substrate; and a plurality of light-emitting control signal lines arranged on the base substrate, and the plurality of light-emitting control signal lines extends in the row direction and intersect with the plurality of data lines in an insulation manner; and the anode does not overlap with the plurality of gate lines and/or the plurality of light-emitting control signal lines extending in the row direction.

In another embodiment of the present disclosure, a display device is provided. The display device includes any display panel provided in the present disclosure.

BRIEF DESCRIPTION OF DRAWINGS

In order to more clearly illustrate embodiments of the present disclosure the accompanying drawings used in the embodiments are briefly described below. The drawings described below are merely a part of the embodiments of the present disclosure.

DESCRIPTION OF EMBODIMENTS

Figure 1:
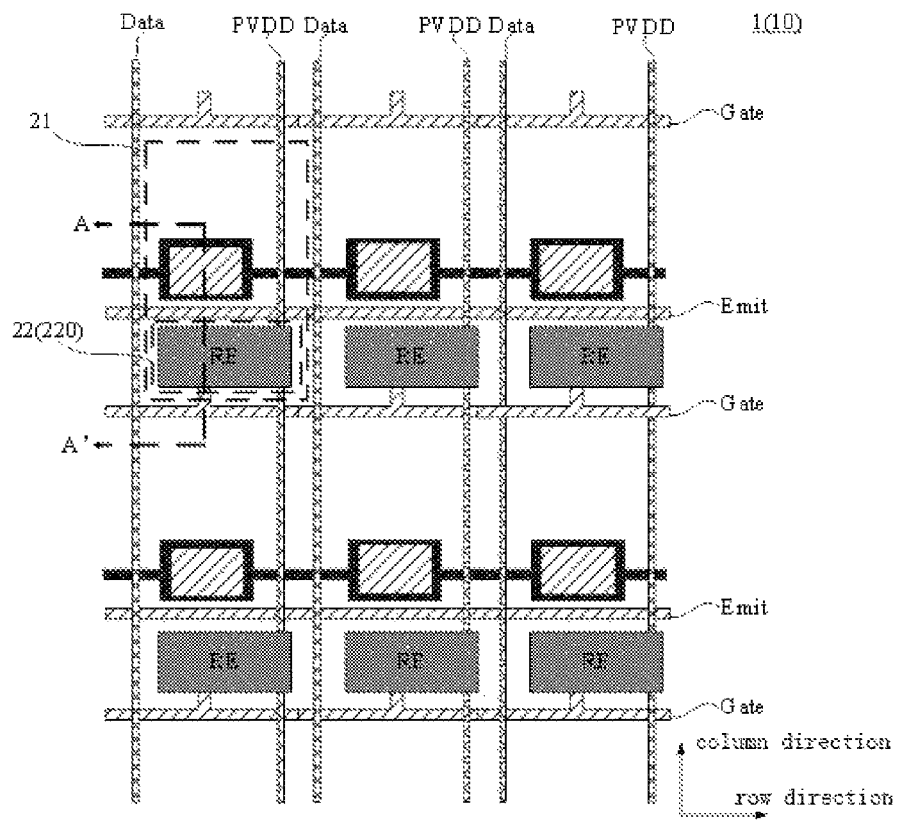
FIG. 1 is a structural schematic diagram showing a display panel according to an embodiment of the present disclosure.

Embodiments of the present disclosure are described in details with reference to the accompanying drawings. The described embodiments are merely part of the embodiments of the present disclosure rather than all of the embodiments.

The terms used in the embodiments of the present disclosure are merely for the purpose of describing specific embodiments, rather than limiting the present disclosure. The terms "a", "an", "the" and "said" in a singular form in the embodiments of the present disclosure and the attached claims are also intended to include plural forms thereof, unless noted otherwise.

It should be understood that the term "and/or" used in the context of the present disclosure is to describe a correlation relation of related objects, indicating that there may be three relations, e.g., A and/or B may indicate only A, both A and B, and only B. In addition, the symbol "/" in the context generally indicates that the relation between the objects before and after the "/" is an "or" relation.

It should be understood that although the terms 'first', 'second' and 'third' may be used in the present disclosure to describe traces, these traces should not be limited to these terms. These terms are used only to distinguish the traces from one another. For example, without departing from the scope of the embodiments of the present disclosure, a first trace may also be referred to as a second trace. Similarly, the second trace may also be referred to as the first trace. In a similar way, a seventh trace may also be referred to as an eighth trace. Similarly, the eighth trace may also be referred to as the seventh trace.

It should be noted that relative terms "above", "below", "left", "right" and the like described in the embodiments of the present disclosure are described in the views shown in the drawings, and should not be construed as limiting the embodiments of the present disclosure. In addition, in the context, it is also to be understood that when an element is referred to as "above" or "below" another element. The element can directly formed "above" or "below" another element. In one embodiment, the element can indirectly formed "above" or "below" another element through an intermediate element.

Figure 2:
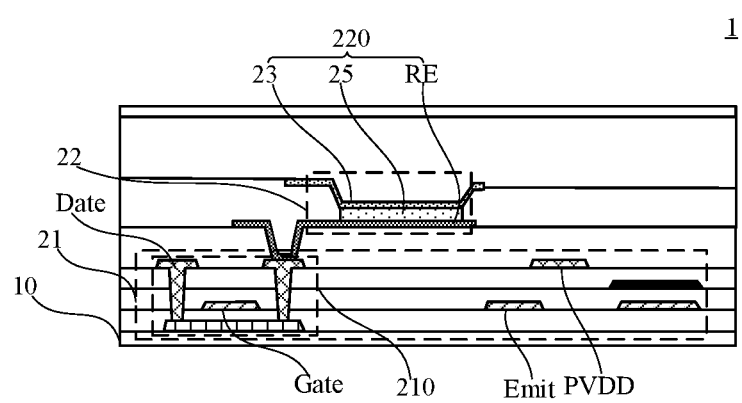
FIG. 2 is a cross-sectional view of a display panel according to an embodiment of the present disclosure at position AA' in FIG. 1.

The present disclosure provides a display panel. As shown in FIGS. 1 and 2, FIG. 1 is a structural schematic diagram showing a display panel according to an embodiment of the present disclosure, and FIG. 2 is a cross-sectional view of a display panel according to an embodiment of the present disclosure at position AA' in FIG. 1. The display panel includes a base substrate 10. The base substrate 10 in this embodiment may be a flexible substrate, and the corresponding display panel 1 may be a flexible display panel having characteristics such as low power consumption and bendability which can be applied to various display devices, particularly wearable display devices. In an embodiment, the materials of the flexible substrate are polyester imide or polyethylene terephthalate resin. In addition, the base substrate 10 may also be a rigid substrate, and the corresponding display panel 1 is a rigid display panel. In fact, the present disclosure does not limit the material of the display panel, the material may be determined according to a specific product.

Referring to FIG. 1, a plurality of gate lines Gate extending in a row direction and a plurality of data lines Data extending in a column direction are arranged on the base substrate 10. The plurality of gate lines Gate and the plurality of data lines Data intersect in an insulation manner to define a plurality of pixel circuit regions 21 including a plurality of pixel circuits (not shown).

Referring to 2, a plurality of sub-pixel regions 22 are further arranged on the substrate 10, each of the plurality of sub-pixel regions 22 includes a light-emitting element 220. The light-emitting element 220 includes an anode RE, a light-emitting layer 25, and a cathode 23 which are sequentially stacked at a side of the base substrate 10. The pixel circuit 210 provides a driving signal to the light-emitting element 220. In an electroluminescence process, the pixel circuit 210 supplies a positive voltage to the anode RE and a negative voltage to the cathode 23.

Referring to FIG. 1, a plurality of light-emitting control signal lines Emit extending in the row direction is arranged on the base substrate 10 and intersecting with the data line Data in an insulation manner. The anode RE does not overlap with the plurality of gate lines Gate and/or the plurality of light-emitting control signal lines Emit extending in the row direction. That is to say, there are the following three cases: in a first case, the anode RE overlaps with the gate line Gate, but does not overlap with the light-emitting control signal line Emit; in a second case, the anode RE overlaps with the light-emitting control signal line Emit, but does not overlap with the gate line Gate; in a third case, the anode RE does not overlap with either the gate line Gate or the light-emitting control signal line Emit. It should be noted that FIG. 1 exemplarily shows only one of the above three cases.

Taking an organic light-emitting element emitting red/green/blue light as an example.

When the organic light-emitting element emitting blue light is turned on, since a threshold voltage of the organic light-emitting element emitting blue light is larger than a threshold voltages of the organic light-emitting element emitting red light and the organic light-emitting element emitting green light, the red light and/or green light are lighted in a blue image, thereby affecting display quality of the display image.

In some embodiments, common film layers can be partitioned, but the process is greatly changed due to the large number of common film layers. Moreover, the inventors found after many experiments that the improvement on phenomenon of undesired light-emission is not significant.

Further, the inventors noticed that when the anode overlaps with the gate lines or the light-emitting control signal lines extending in the row direction, the phenomenon of undesired light-emission is more serious. After further experiments, the inventors found that after the anode overlaps with the light-emitting control signal lines, a parasitic coupling capacitance is generated, that is, at a position where no capacitor is provided, or between traces, an unnecessary capacitor is generated since two circuit elements interact with each other, and the residual charge causes serious phenomenon of undesired light-emission. The above circuit elements may be understood as an anode and a signal line, the signal line may include: a data line Data, a power supply signal line PVDD, a gate line Gate or a light-emitting control signal line Emit, and the like. The data line Data and the power supply signal line PVDD extend in the column direction. The gate line Gate and the light-emitting control signal line Emit extend in the row direction.

In a manufacturing process, since the anode RE doses not overlap with the gate line Gate and/or the light-emitting control signal line Emit extending in the row direction, parasitic coupling capacitance generated between the anode RE and the gate line Gate is weakened or even avoided; in another embodiment, parasitic coupling capacitance generated between the anode RE and the light-emitting control signal line Emit is weakened or even avoided; or in a further embodiment, there is no parasitic coupling capacitance generated between the anode RE and the gate line Gate or between the anode RE and the light-emitting control signal line Emit, thereby solving the problem that the light-emitting elements emitting light of other colors having a lower threshold voltage are turned on when the light-emitting element having a higher threshold voltage is turned on, and thereby improving the quality of the display image. Meanwhile, since the generation of the parasitic coupling capacitance is avoided, the power consumption of the display panel 1 is lowered. Compared with the related art, in this embodiment, the situation that the light-emitting element having a lower threshold voltage is lighted when turning on the light-emitting element having a higher threshold voltage is avoided, thereby effectively improving the quality of the display image and lowering the power consumption of the display panel.

In an embodiment, the display panel 1 may be an organic light-emitting display panel. The light-emitting principle of the display panel will be briefly introduced below with reference to FIG. 2.

Under an applied electric field, electrons e are injected from the cathode 23 to the light-emitting layer 25, and holes h are injected from the anode RE to the light-emitting layer 25. The injected electrons e and the injected holes h generate excitons after recombination in the light-emitting layer 25. The excitons migrate under the electric field, and energy is transmitted to the organic luminescent molecules in the light-emitting layer 25. The electrons of the organic luminescent molecules jump from the ground state to the excited state and releases energy, and finally the energy is released in a form of photons to emit light.

Figure 3:
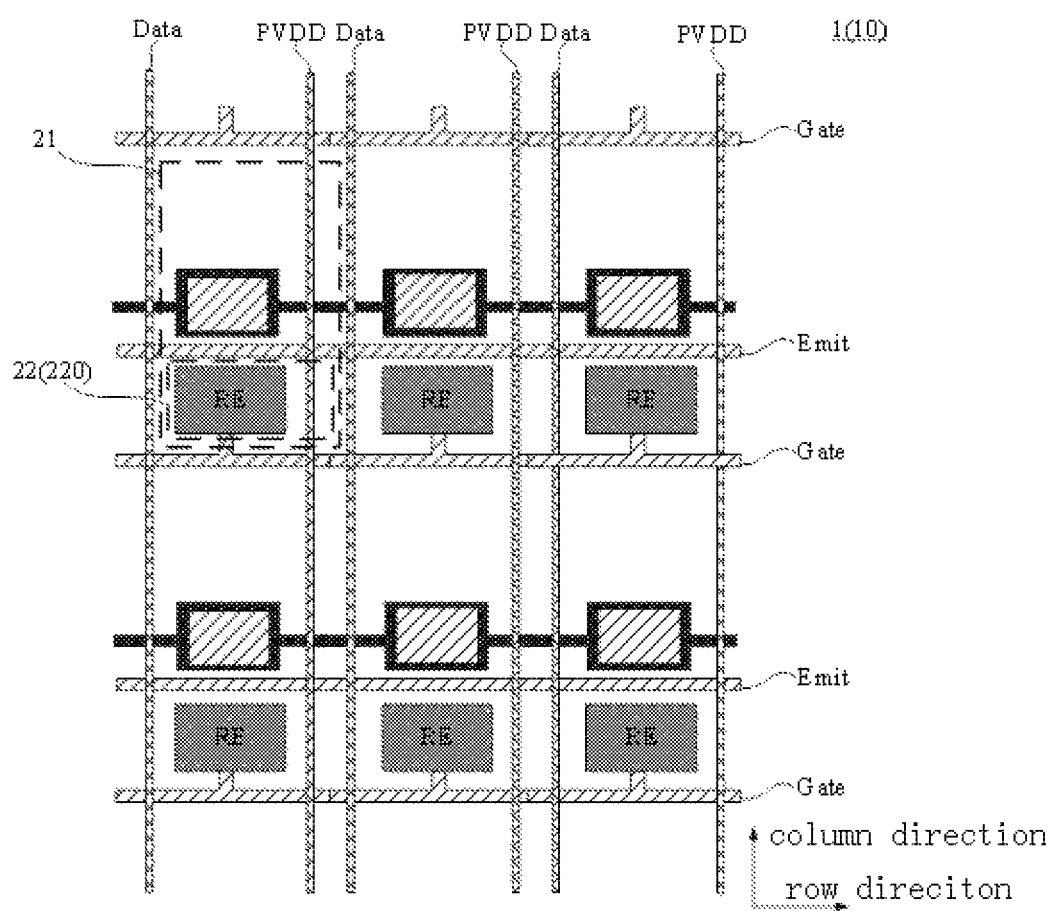
FIG. 3 is a structural schematic diagram showing a display panel according to another embodiment of the present disclosure.

FIG. 3 is a structural schematic diagram showing a display panel according to another embodiment of the present disclosure. In an embodiment, as shown in FIG. 3, a plurality of power signal lines PVDD extending in the column direction is arranged on the base substrate 10 and intersecting with the plurality of gate lines Gate in an insulation manner. The anode RE does not overlap with the plurality of data lines Data extending in the column direction and/or the plurality of power signal lines PVDD extending in the column direction. That is to say, there are the following three cases: in a first case, the anode RE does not overlap with the data line Data, but overlap with the power signal line PVDD; in a second case, the anode RE does not overlap with the power signal line PVDD, but overlap with the data line Data; in a third case, the anode RE does not overlap with either the data line Data or the power signal line PVDD. FIG. 3 exemplarily shows only one of the above three cases.

Figure 4:
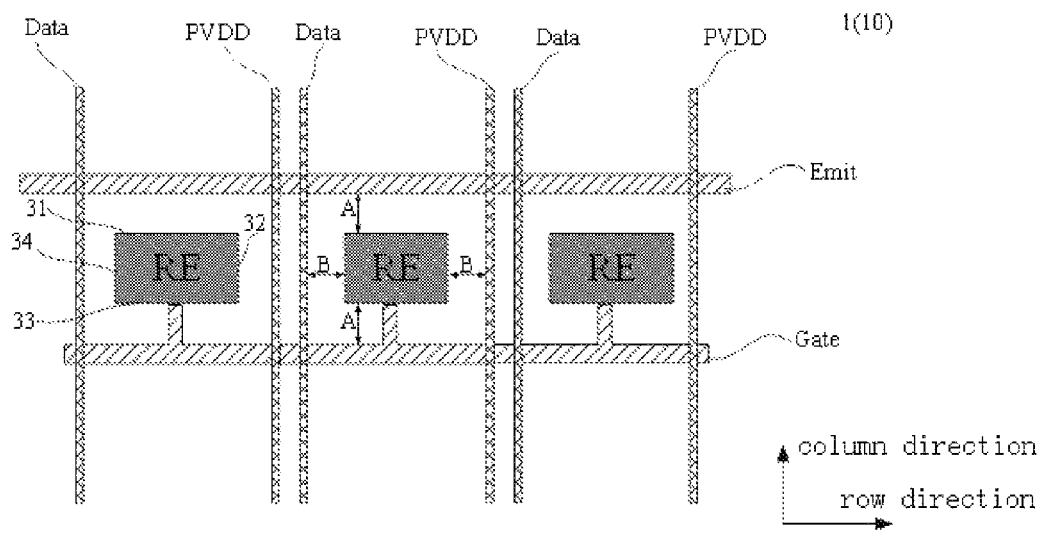
FIG. 4 is a structural schematic diagram showing a display panel according to another embodiment of the present disclosure.

Since the parasitic coupling capacitance is generated after the anode RE overlaps with the signal line, in order to obtain a display panel with better performance, based on the above embodiments, the anode RE does not overlap with the data line Data and/or the power signal line PVDD extending in the column direction in this embodiment, that is, the anode RE does not overlap with any one of the data line Data, the power signal line PVDD, the gate line Gate, and the light-emitting control signal line Emit, thereby avoiding generation of the parasitic coupling capacitance, further avoiding the appearance of undesired light-emission, and thus improving display effect and reducing the power consumption of the display panel. FIG. 4 is a structural schematic diagram showing a display panel according to another embodiment of the present disclosure. Further, in an embodiment, as shown in FIG. 4, the anode RE includes a first side 31, a second side 32, a third side 33 and a fourth side 34 which are connected end-to-end, both a distance between the first side 31 and the plurality of gate lines Gate and/or the plurality of light-emitting control signal lines Emit extending in the row direction and a distance between the third side 33 and the plurality of gate lines Gate and/or the plurality of light-emitting control signal lines Emit extending in the row direction are A, and A≥0.5 μm.

In an embodiment, since there is a certain distance between the anode RE and the gate line Gate and/or the light-emitting control signal line Emit, no coupling capacitance is generated between the anode RE and the gate line Gate or the light-emitting control signal line Emit, so that the risk of storing charge by the coupling capacitance is reduced, the situation that the light-emitting element having a lower threshold voltage is lighted when turning on the light-emitting element having a higher threshold voltage is avoided, thereby effectively improving display effect of the display panel and lowering the power consumption of the display panel.

It should be noted that the distance A between the anode RE and the gate line Gate and/or the light-emitting control signal line Emit cannot be too small, which may increase the possibility of generating a coupling capacitance. Therefore, the range of the distance A in the present embodiment is set to be 0.5 μm or greater.

Moreover, it should be noted that, since each of the plurality of light-emitting elements corresponds to one anode block, the area of the anode block corresponds to the aperture ratio of the light-emitting element. In an actual production process, the area of the anode is relatively large, and an actual usage area of the anode block is limited, therefore, although the distance between the anode RE and the signal line extending in the row direction is set in this embodiment, it does not affect the area for normal use of the anode, and does not affect the light-emitting element.

Similarly, in another embodiment, as shown in FIG. 4, both a distance between the second side 32 and the plurality of data lines Data and/or the plurality of power signal lines PVDD extending along a column direction and a distance between the fourth side 34 and the plurality of data lines Data and/or the plurality of power signal lines PVDD extending along a column direction are B, and B≥0.5 μm. In this embodiment, since there is a certain distance between the anode RE and the data line Data and/or the power signal line PVDD, no coupling capacitance is generated between the anode RE and the data line Data and/or the power signal line PVDD, so that the risk of storing charge by the coupling capacitance is reduced, the situation that the light-emitting element having a lower threshold voltage is lighted when turning on the light-emitting element having a higher threshold voltage is avoided, thereby effectively improving display effect of the display panel and lowering the power consumption of the display panel.

Figure 5:
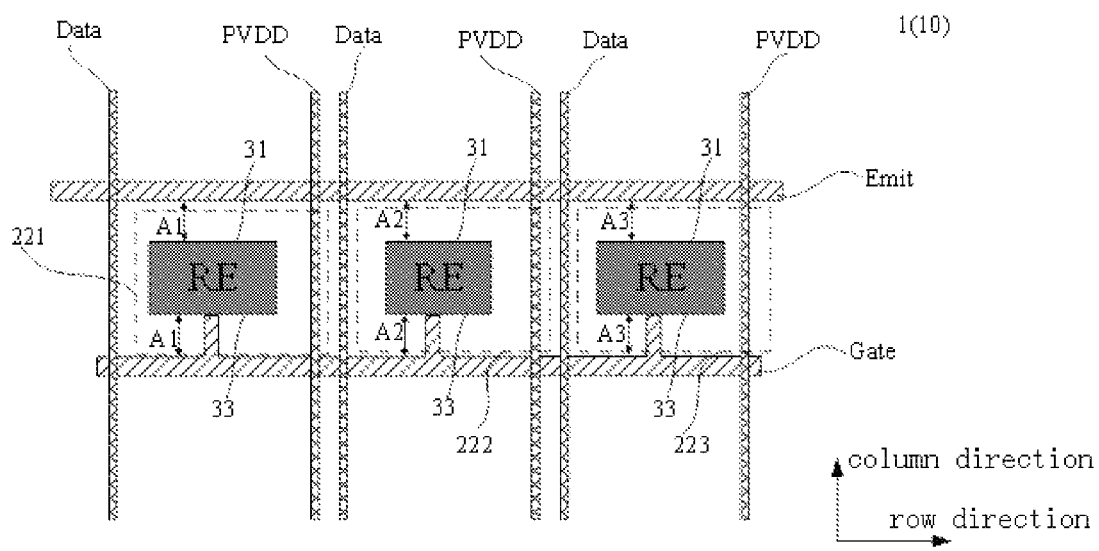
FIG. 5 is a structural schematic diagram showing a display panel according to another embodiment of the present disclosure.

FIG. 5 is a structural schematic diagram showing a display panel according to another embodiment of the present disclosure. In another embodiment, as shown in FIG. 5, the plurality of sub-pixel regions 220 at least includes a first color sub-pixel region 221, a second color sub-pixel region 222, and a third color sub-pixel region 223. Both a distance between the first side 31 of the anode RE in the first color sub-pixel region 221 and the plurality of gate lines Gate and/or the plurality of light-emitting control signal lines Emit extending in the row direction and a distance between the third side 33 of the anode RE in the first color sub-pixel region 221 and the plurality of gate lines Gate and/or the plurality of light-emitting control signal lines Emit extending in the row direction are A1, and A1≥0.5 μm. Both a distance between the first side 31 of the anode RE in the second color sub-pixel region 222 and the plurality of gate lines Gate and/or the plurality of light-emitting control signal lines Emit extending in the row direction and a distance between the third side 33 of the anode RE in the second color sub-pixel region 222 and the plurality of gate lines Gate and/or the plurality of light-emitting control signal lines Emit extending in the row direction are A2, and A2≥0.5 μm. Both a distance between the first side 31 of the anode RE in the third color sub-pixel region 223 and the plurality of gate lines Gate and/or the plurality of light-emitting control signal lines Emit extending in the row direction and a distance between the third side 33 of the anode RE in the third color sub-pixel region 223 and the plurality of gate lines Gate and/or the plurality of light-emitting control signal lines Emit extending in the row direction are A3, and A3≥0.6 μm.

It can be understood that, in an embodiment, the first light-emitting color light-emitting element is included in the first color sub-pixel region 221, the second light-emitting color light-emitting element is included in the second color sub-pixel region 222, and the third light-emitting color light-emitting element is included in the third color sub-pixel region 223.

Taking the light-emitting control signal line as an example, because the light-emitting control signal line overlaps with the anode, a coupling capacitor is generated. At this time, the light-emitting control signal line and the anode may be required to be separated to avoid generation of coupling capacitance due to overlapping. The greater the distance between the light-emitting control signal line and the anode, the smaller the influence between the light-emitting control signal line and the anode, and the less likely the coupling capacitance is generated. However, since the display panel becomes to have more and more functions, such as implementations of fingerprint recognition, touch, press, the corresponding traces also become more and more, and the adjustable distance between the light-emitting control signal line and the anode is limited. Moreover, since the threshold voltages of the light-emitting elements emitting light of three different colors are different, the light-emitting element having a higher threshold voltage has a large coupling capacitance with the light-emitting control signal lines, so that the coupling capacitance can be avoided only when the distance between the light-emitting control signal line and the anode is large. That is to say, the larger the threshold voltage of the light-emitting element, the larger the distance may be required to avoid the coupling capacitance.

In an embodiment, the distance between the light-emitting elements and the gate line and/or the light-emitting control signal line is set according to the threshold voltages of the light-emitting elements emitting light of three different colors, thereby maximally avoiding generation of the parasitic coupling capacitance between the anode of the light-emitting elements emitting light of three different colors and the gate line and/or the light-emitting control signal lines, and thus improving display quality.

Further, in combination with the foregoing embodiments, the first color sub-pixel region 221 may be a red sub-pixel region which may include a light-emitting element emitting red light; the second-color sub-pixel region 222 may be a green sub-pixel region which may include a light-emitting element emitting green light, and the third-color sub-pixel region 223 may be a blue sub-pixel region which may include a light-emitting element emitting blue light.

Since the threshold voltage of the light-emitting element emitting blue light included in the blue sub-pixel region is higher than the threshold voltage of the remaining light-emitting elements emitting light of different colors, the distance between the corresponding anode RE in the blue sub-pixel region and the signal lines extending in the row direction adjacent to the anode RE can be set larger to avoid generation of the parasitic coupling capacitance.

In the above embodiment, the anode is modified so as to avoid the parasitic coupling capacitance between the anode and the signal lines (gate lines, data lines, light-emitting control signal lines, and voltage signal lines) that have already been described. Hereinafter, in another embodiment, the signal line can be improved to bypass the anode, and the purpose of avoiding parasitic coupling capacitance can also be achieved.

Figure 6:
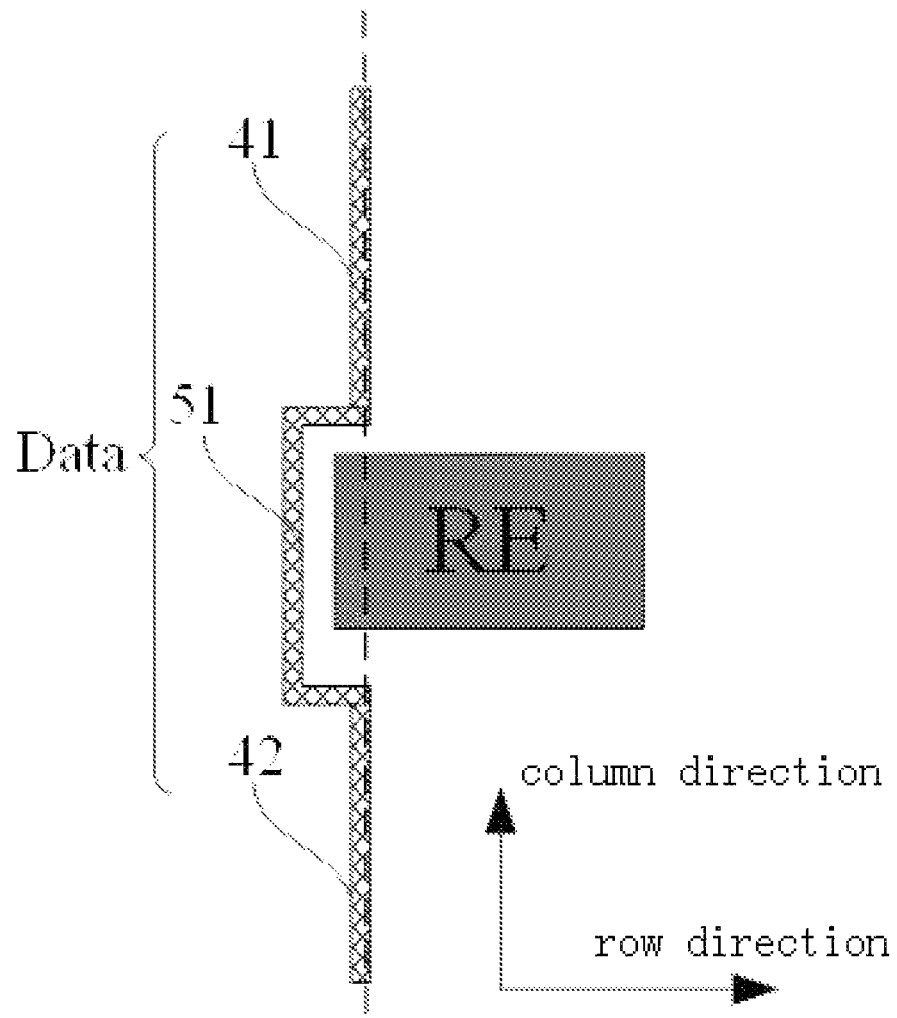
FIG. 6 is a structural schematic diagram showing a display panel according to another embodiment of the present disclosure.

A first manner is described as follows. FIG. 6 is a structural schematic diagram showing a display panel according to another embodiment of the present disclosure. As shown in FIG. 6, each of the plurality of data lines Data includes a first trace 41, a second trace 42, and a first winding 51 connecting the first trace 41 and the second trace 42. The first trace 41 and the second trace 42 are in a same straight line, and an extension of the first trace 41 and/or the second trace 42 overlaps with the anode RE, however, the first winding 51 does not overlap with the anode RE.

In an embodiment, in the column direction, the data line Data bypasses the region where the anode RE is located, so as to bypass the anode RE, so that the data line Data does not overlap with the anode RE, no coupling capacitance is generated, the situation that the light-emitting element having a lower threshold voltage is passively lighted when the light-emitting element having a higher threshold voltage is turned on is avoided, even the situation of undesired lighting is avoided, thereby improving display effect of the display panel and lowering the power consumption of the display panel.

In addition, in an embodiment, the anode area is not reduced, and the aperture ratio of the light-emitting element is achieved, thereby ensuring display quality.

It should be noted that, as shown in FIG. 6, the exemplary first winding has a groove-like structure. In fact, the shape of the first winding is not particularly limited in the embodiments, as long as it can bypass the anode, and does not overlap with the anode.

Figure 7:
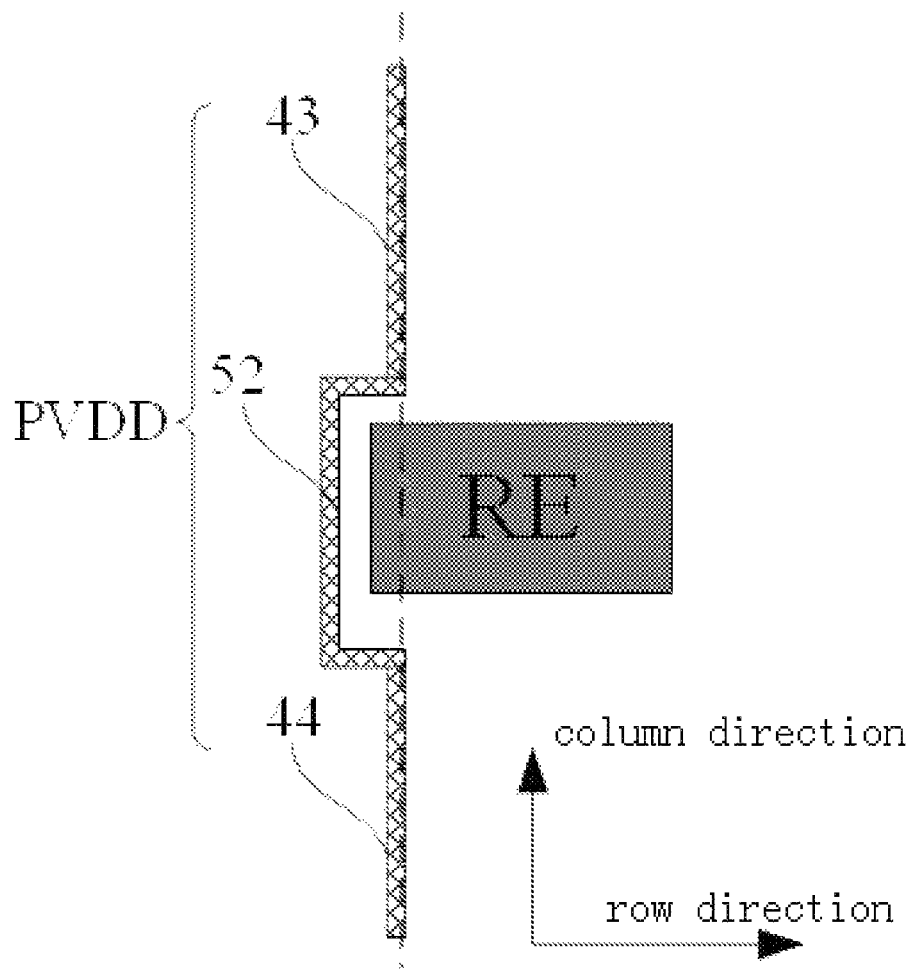
FIG. 7 is a structural schematic diagram showing a display panel according to another embodiment of the present disclosure.

A second manner is described as follows. FIG. 7 is a structural schematic diagram showing a display panel according to another embodiment of the present disclosure. As shown in FIG. 7, each of the plurality of power signal lines PVDD includes a third trace 43, a fourth trace 44, and a second winding 52 connecting the third trace 43 and the fourth trace 44. The third trace 43 and the fourth trace 44 are in a same straight line, and an extension of the third trace 43 and the fourth trace 44 overlaps with the anode RE, however, the second winding 52 does not overlap with the anode RE.

In an embodiment, in the column direction, the power signal line PVDD bypasses the region where the anode RE is located, so as to bypass the anode RE, so that the power signal line PVDD does not overlap with the anode RE, no coupling capacitance is generated, the situation that the light-emitting element having a lower threshold voltage is passively lighted when the light-emitting element having a higher threshold voltage is turned on is avoided, even the situation of undesired lighting is avoided, thereby improving display effect of the display panel and lowering the power consumption of the display panel.

In addition, in an embodiment, the anode area is not reduced, and the aperture ratio of the light-emitting element is achieved, thereby ensuring display quality.

Figure 8:
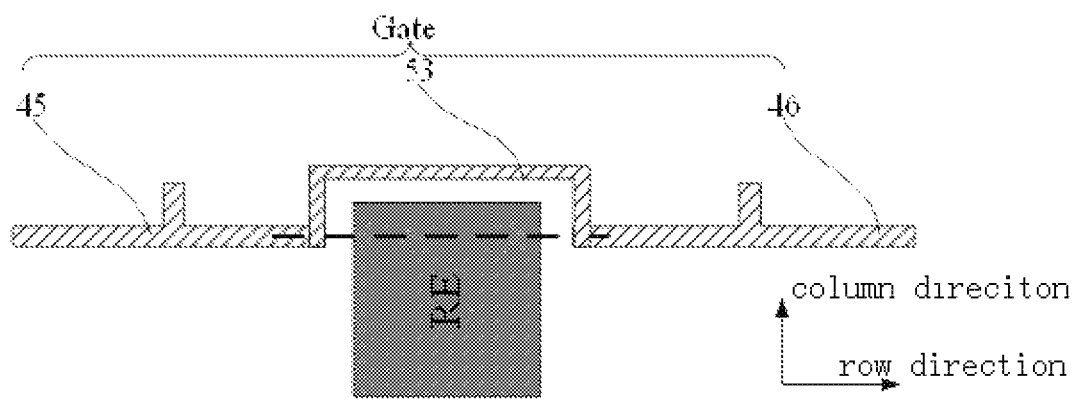
FIG. 8 is a structural schematic diagram showing a display panel according to another embodiment of the present disclosure.

A third manner is described as follows. FIG. 8 is a structural schematic diagram showing a display panel according to another embodiment of the present disclosure. As shown in FIG. 8, each of the plurality of gate lines Gate includes a fifth trace 45, a sixth trace 46, and a third winding 53 connecting the fifth trace 45 and the sixth trace 46. The fifth trace 45 and the sixth trace 46 are in a same straight line, and an extension of the fifth trace 45 and the sixth trace 46 overlaps with the anode RE, however, the third winding 53 does not overlap with the anode RE.

In an embodiment, in the row and column directions, the gate line Gate bypasses the region where the anode RE is located, so as to bypass the anode RE, so that the gate line Gate does not overlap with the anode RE, no coupling capacitance is generated, the situation that the light-emitting element having a lower threshold voltage is passively lighted when the light-emitting element having a higher threshold voltage is turned on is avoided, even the situation of undesired lighting is avoided, thereby improving display effect of the display panel and lowering the power consumption of the display panel.

In addition, in an embodiment, the anode area is not reduced, and the aperture ratio of the light-emitting element is achieved, thereby ensuring display quality.

Figure 9:
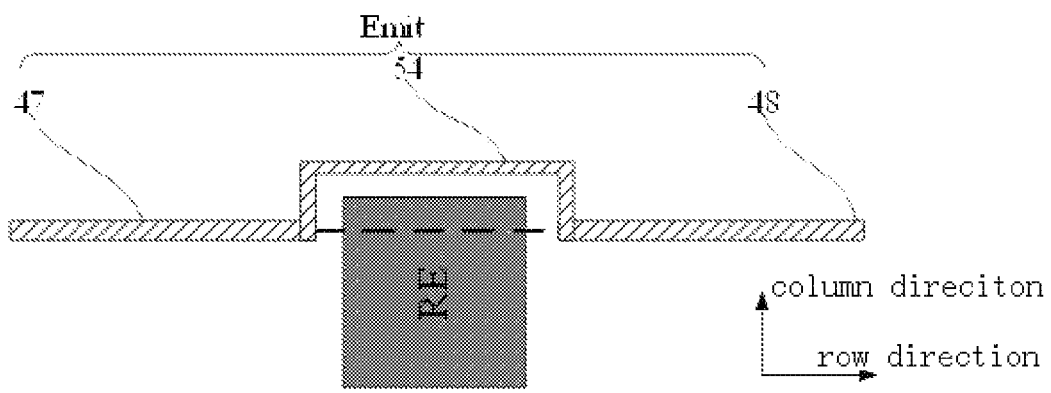
FIG. 9 is a structural schematic diagram showing a display panel according to another embodiment of the present disclosure.

A fourth manner is described as follows. FIG. 9 is a structural schematic diagram showing a display panel according to another embodiment of the present disclosure. As shown in FIG. 9, each of the plurality of light-emitting control signal lines Emit includes a seventh trace 47, an eighth trace 48, and a fourth winding 54 connecting the seventh trace 47 and the eighth trace 48. The seventh trace 47 and the eighth trace 48 are in a same straight line, and an extension of the seventh trace 47 and the eighth trace 48 overlaps with the anode RE, however, the fourth winding 54 does not overlap with the anode RE.

In an embodiment, in the row and column directions, the light-emitting control signal line Emit bypasses the region where the anode RE is located, so as to bypass the anode RE, so that the light-emitting control signal line Emit does not overlap with the anode RE, no coupling capacitance is generated, the situation that the light-emitting element having a lower threshold voltage is passively lighted when the light-emitting element having a higher threshold voltage is turned on is avoided, even the situation of undesired lighting is avoided, thereby improving display effect of the display panel and lowering the power consumption of the display panel.

In addition, in an embodiment, the anode area is not reduced, and the aperture ratio of the light-emitting element is achieved, thereby ensuring display quality.

Referring to FIG. 2, in an embodiment, each of the plurality of light-emitting control signal lines Emit provides a light-emitting control signal to the light-emitting element 220. The light-emitting control signal line Emit and the gate line Gate are arranged in a same layer, i.e., both in the gate metal layer, which can reduce the thickness of the film layer, so that the display panel is lighter and thinner to conform to the popular trend.

Referring to FIG. 2, in another embodiment, each of the plurality of power signal lines PVDD provides a constant high potential signal to the light-emitting element 220. The plurality of power signal lines PVDD and the plurality of data lines Data are arranged in a same layer. In this embodiment, the data line Gate is arranged in a same layer as the power signal line PVDD, which can further reduce the thickness of the film layer, make the display panel 1 lighter and thinner, and reduce the process steps as well as the production cost.

Figure 10:
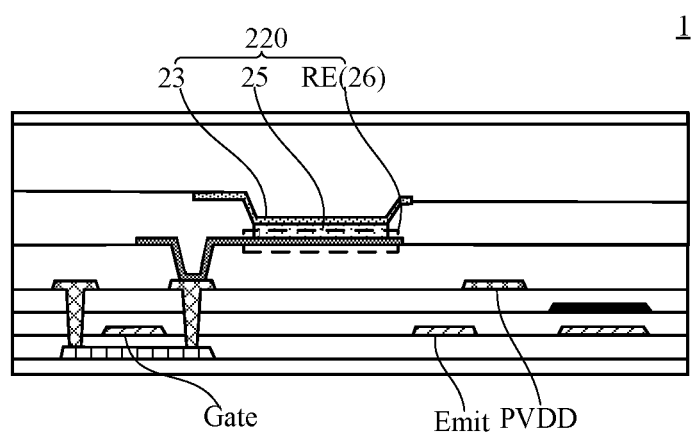
FIG. 10 is another cross-sectional view of a display panel according to an embodiment of the present disclosure at position AA' in FIG. 1.

FIG. 10 is another cross-sectional view of a display panel according to an embodiment of the present disclosure at position AA' in FIG. 1. In an embodiment, as shown in FIG. 10, since the anode block is arranged corresponding to the light-emitting element 220, in order to ensure the aperture area of the light-emitting element and thus aperture ratio thereof, the area of the anode block is set in the present embodiment. The anode RE includes a plurality of anode blocks 26 arranged in one-to-one correspondence with the light-emitting element 220, and an area of each anode block is S, and S≥144 µm$^2$, such a size range is suitable for small and medium sized OLED display panels.

Figure 11:
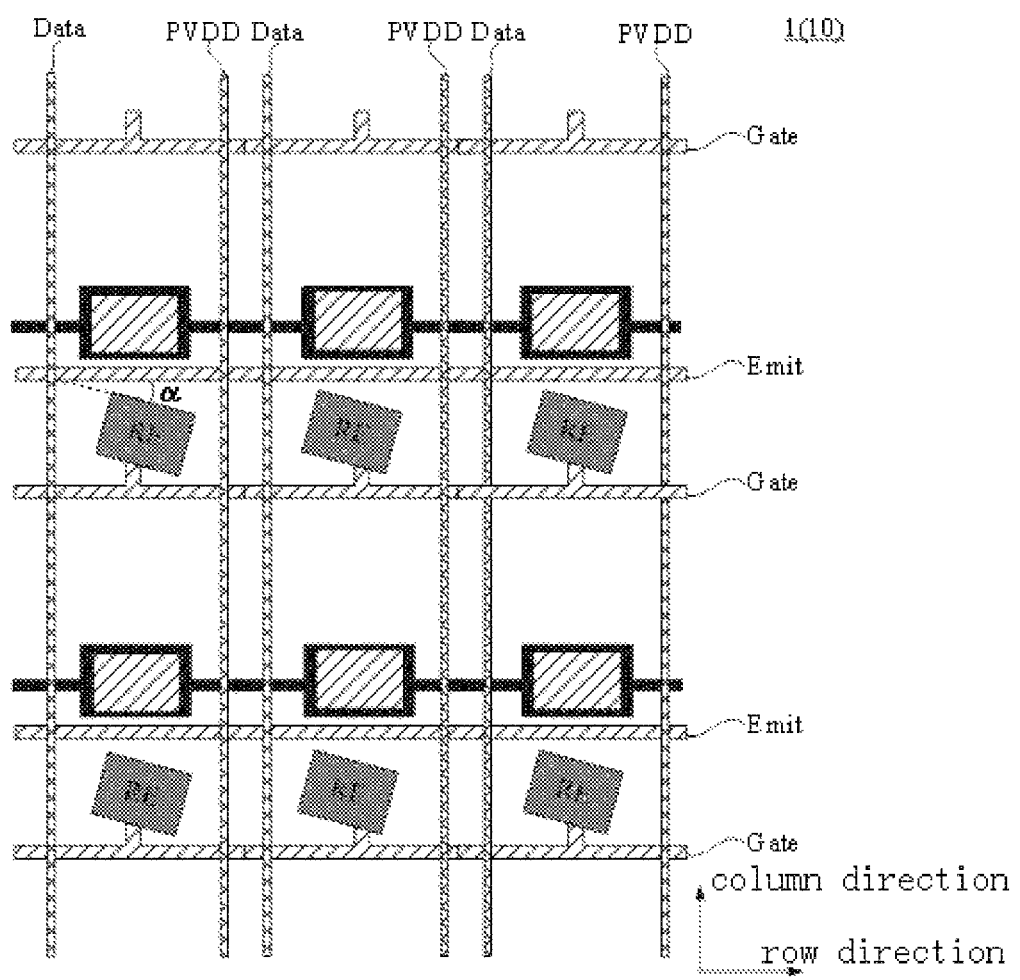
FIG. 11 is a structural schematic diagram showing a display panel according to another embodiment of the present disclosure.

FIG. 11 is a structural schematic diagram showing a display panel according to another embodiment of the present disclosure. In another embodiment, as shown in FIG. 11, the anode RE has a quadrangle shape, and an angle α between an extension of at least one pair of sides of the anode RE and the row direction satisfies: $0°<\alpha<90°$.

In an embodiment, in order to better utilize the space on the substrate 10, the anode RE may be obliquely arranged so as to have an angle with respect to the row direction, which facilitates the arrangement of the signal lines, so that the integration level of the substrate is higher.

In addition, when the display panel is provided with a light-sensing fingerprint recognition region, touch control is realized by sensing light. Since the pixel circuit includes a plurality of thin-film transistors and storage capacitors, a plurality of metal film layers and metal traces are arranged in a region where the pixel circuit is located, based on the opaque characteristics of the metal structure, during the fingerprint recognition process, when the light reflected by the touch body propagates to a portion of the metal film layer and/or the metal trace, most of the reflected lights may be blocked by the portion of the metal structure and then cannot emit out. Even there are scattered light-transmitting regions for light transmission, since these regions are scattered, they are ignored by the fingerprint recognition unit, that is, the lights in this region is invalid for fingerprint recognition. Therefore, the sub-pixel region corresponding to this region can be understood as a non-primary light-transmitting region in the pixel circuit region. For the sub-pixel region, the numbers of the metal film layer and the metal traces arranged in these portions of the region is small, and the transmittance of the light is high. During the fingerprint recognition process, most of the reflected lights enter into the fingerprint recognition region through these portions of the region. These portions of the region can be understood as the primary light transmission region.

Since the anode is arranged in the main light-transmitting region and is overlapped therewith, the anode can be rotated to have an angle with respect to the row direction, thereby increasing the light transmittance, and improving the touch sensitivity.

Further, $30°≤\alpha≤70°$. For the angle α, when α is too large, the space occupied by the anode is large; and when α is too small, the rotation angle of the anode relative to the row direction is too small without significantly reducing the shielding area of the anode to the main transmission region which, in turn, may cause that the transmittance of reflected light cannot be significantly improved. To this end, in this embodiment, 30°≤α≤70° can be set, and under the premise of ensuring a sufficient number of anodes, the shielding area of the anode to the main light-transmitting region can be significantly reduced.

Figure 12:
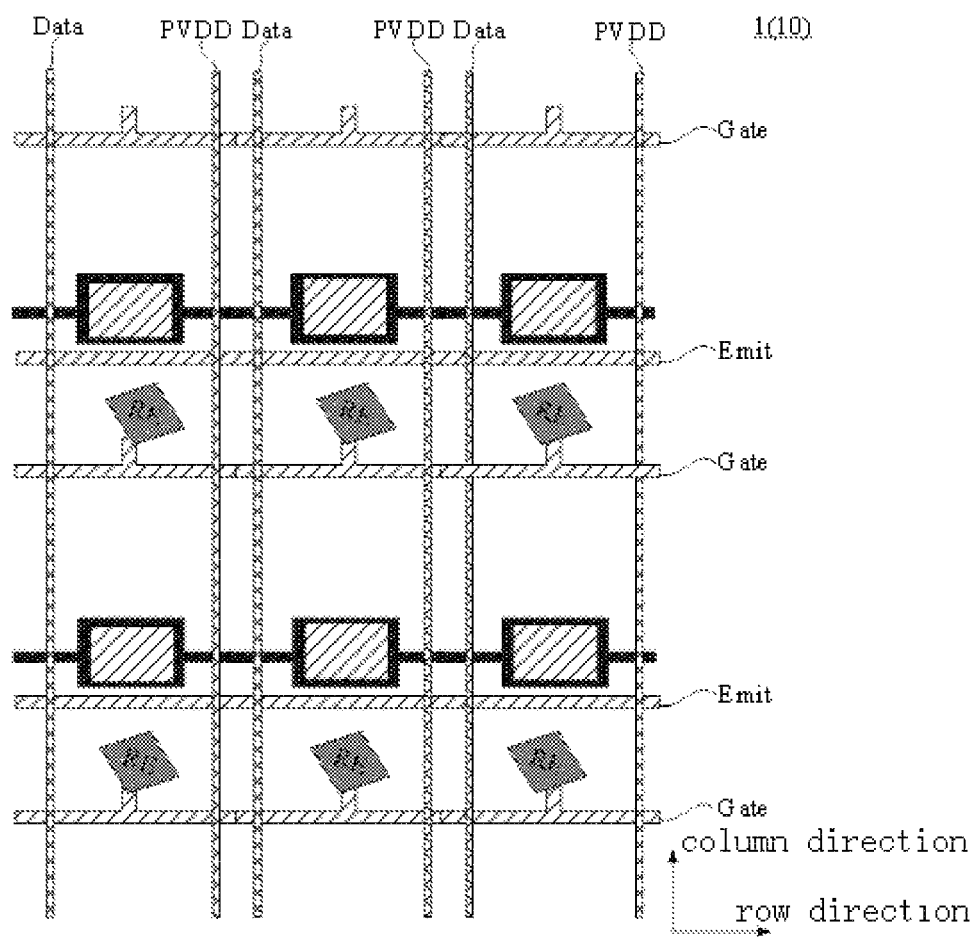
FIG. 12 is a structural schematic diagram showing a display panel according to another embodiment of the present disclosure.

FIG. 12 is a structural schematic diagram showing a display panel according to another embodiment of the present disclosure. In an embodiment, as shown in FIG. 12, the anode RE has a diamond shape. The diamond shape can further reduce its shielding area to the main light-transmission region compared to a quadrilateral having a uniform diagonal length (e.g., when the quadrilateral is a rectangle or a square).

It should be noted that, for example, in an embodiment, the anode has a diamond shape. In fact, in this embodiment, the shape of the anode RE can be set according to the arrangement of the base substrate, which depends on a specific product.

Figure 13:
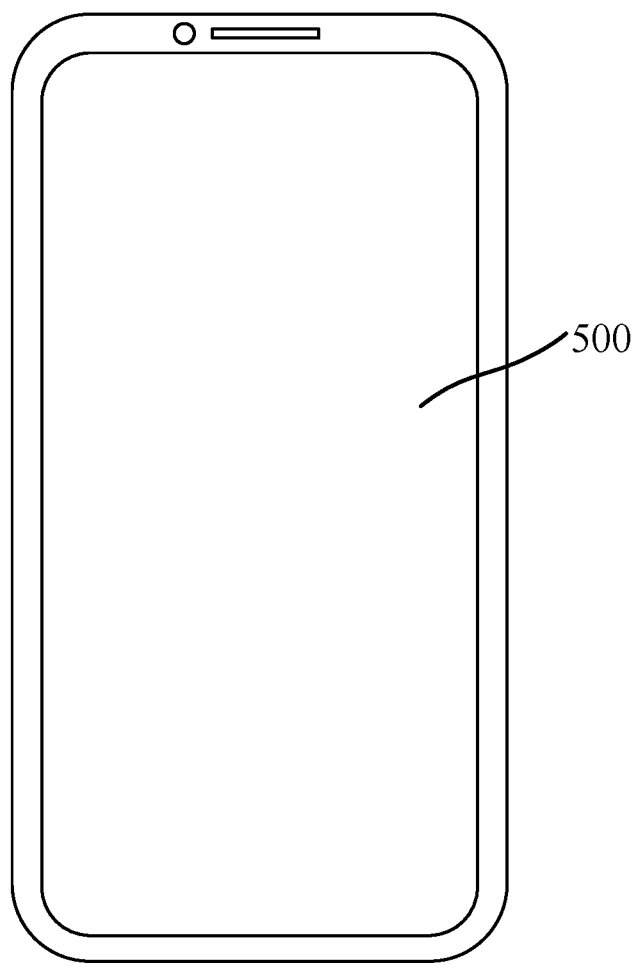
FIG. 13 is a structural schematic diagram showing a display device according to an embodiment of the present disclosure.

FIG. 13 is a structural schematic diagram showing a display device according to an embodiment of the present disclosure. As shown in FIG. 13, the display device 500 includes the display panel 1 described above. It should be noted that although FIG. 13 is exemplified by a mobile phone, the display device is not limited to a mobile phone. The display device may include, but is not limited to, electronic devices such as a personal computer (PC), a personal digital assistant (PDA), a wireless handheld device, a tablet computer, a MP4 player or a television.

In the preparation process according to the embodiments of the present disclosure, since the anode does not overlap with the gate lines and/or the light-emitting control signal lines extending in the row direction, the parasitic coupling capacitance generated between the anode and the gate lines is weakened or even avoided; in another embodiment, the parasitic coupling capacitance generated between the anode and the light-emitting control signal line is weakened or even avoided; in a further embodiment, the parasitic coupling capacitances generated between the anode and the gate line and between the anode and the light-emitting control signal line are weakened or even avoided, thereby improving the situation that the light-emitting elements of emitting light of other colors having a lower threshold voltage are turned on when the light-emitting element having a higher threshold voltage is turned on, and thereby improving the quality of the display image. Meanwhile, since the generation of the parasitic coupling capacitance is avoided, the power consumption of the display panel is lowered. Compared with the related art, in the embodiments of the present disclosure, the situation that the light-emitting element having a lower threshold voltage is lighted when turning on the light-emitting element having a higher threshold voltage is avoided, thereby effectively improving the quality of the display image and lowering the power consumption of the display panel.

What is claimed is:

1. A display panel, comprising:
a base substrate;
a plurality of gate lines extending in a row direction and a plurality of data lines extending in a column direction arranged on the base substrate, wherein the plurality of gate lines and the plurality of data lines intersect in an insulation manner to define a plurality of pixel circuit regions comprising a plurality of pixel circuits;
a plurality of sub-pixel regions arranged on the base substrate, wherein each of the plurality of sub-pixel regions comprises a light-emitting element, a corresponding one of the plurality of pixel circuits provides a driving signal to the light-emitting element, and the light-emitting element comprises an anode, a light-emitting layer and a cathode which are sequentially stacked at a side of the base substrate; and
a plurality of light-emitting control signal lines arranged on the base substrate, wherein the plurality of light-emitting control signal lines extends in the row direction and intersect with the plurality of data lines in an insulation manner;
wherein the anode does not overlap with the plurality of gate lines and/or the plurality of light-emitting control signal lines extending in the row direction.

2. The display panel according to claim 1, further comprising a plurality of power signal lines arranged on the base substrate,
wherein the plurality of power signal lines extends in the column direction and intersects with the plurality of gate lines in an insulation manner; and
the anode does not overlap with the plurality of data lines and/or the plurality of power signal lines extending in the column direction.

3. The display panel according to claim 2, wherein the anode comprises a first side, a second side, a third side and a fourth side which are connected end-to-end, a distance between the first side and the plurality of gate lines and/or the plurality of light-emitting control signal lines extending in the row direction is A, and a distance between the third side and the plurality of gate lines and/or the plurality of light-emitting control signal lines extending in the row direction is also A, wherein A≥0.5 μm.

4. The display panel according to claim 3, wherein a distance between the second side and the plurality of data lines and/or the plurality of power signal lines extending along a column direction is B, and a distance between the fourth side and the plurality of data lines and/or the plurality of power signal lines extending along a column direction is also B, wherein B≥0.5 μm.

5. The display panel according to claim 3, wherein the plurality of sub-pixel regions at least comprises a first color sub-pixel region, a second color sub-pixel region, and a third color sub-pixel region;
a distance between the first side of the anode in the first color sub-pixel region and the plurality of gate lines and/or the plurality of light-emitting control signal lines extending in the row direction is A1, and a distance between the third side of the anode in the first color sub-pixel region and the plurality of gate lines and/or the plurality of light-emitting control signal lines extending in the row direction is also A1, wherein A1≥0.5 μm;
a distance between the first side of the anode in the second color sub-pixel region and the plurality of gate lines and/or the plurality of light-emitting control signal lines extending in the row direction is A2, and a distance between the third side of the anode in the second color sub-pixel region and the plurality of gate lines and/or the plurality of light-emitting control signal lines extending in the row direction is also A2, wherein A2≥0.5 μm; and
a distance between the first side of the anode in the third color sub-pixel region and the plurality of gate lines and/or the plurality of light-emitting control signal lines extending in the row direction is A3, and a distance between the third side of the anode in the third color sub-pixel region and the plurality of gate lines and/or the plurality of light-emitting control signal lines extending in the row direction is also A3, wherein A3≥0.6 μm.

6. The display panel according to claim 5, wherein the first color sub-pixel region is a red sub-pixel region, the second color sub-pixel region is a green sub-pixel region, and the third color sub-pixel region is a blue sub-pixel region.

7. The display panel according to claim 2, wherein each of the plurality of data lines comprises a first trace, a second trace, and a first winding connecting the first trace and the second trace;
the first trace and the second trace are collinear, and an extension of the first trace and/or the second trace overlaps with the anode; and
the first winding does not overlap with the anode.

8. The display panel according to claim 2, wherein each of the plurality of power signal lines comprises a third trace, a fourth trace, and a second winding connecting the third trace and the fourth trace line;
the third trace and the fourth trace are collinear, and an extension of the third trace and/or the fourth trace overlaps with the anode; and
the second winding does not overlap with the anode.

9. The display panel according to claim 1, wherein each of the plurality of gate lines comprises a fifth trace, a sixth trace, and a third winding connecting the fifth trace and the sixth trace;
the fifth trace and the sixth trace are collinear, and an extension of the fifth trace and/or the sixth trace overlaps with the anode; and
the third winding does not overlap with the anode.

10. The display panel according to claim 1, wherein each of the plurality of light-emitting control signal lines comprises a seventh trace, an eighth trace, and a fourth winding connecting the seventh trace and the eighth trace;
the seventh trace and the eighth trace are collinear, and an extension of the seventh trace and/or the eighth trace overlaps with the anode; and
the fourth winding does not overlap with the anode.

11. The display panel according to claim 1, wherein each of the plurality of light-emitting control signal lines provides a light-emitting control signal to the light-emitting element; and
the plurality of light-emitting control signal lines and the plurality of gate lines are arranged in a same layer.

12. The display panel according to claim 2, wherein each of the plurality of power signal lines provides a constant high potential signal to the light-emitting element; and
the plurality of power signal lines and the plurality of data lines are arranged in a same layer.

13. The display panel according to claim 1, wherein the anode comprises a plurality of anode blocks arranged in one-to-one correspondence with the light-emitting element, and
an area of each of the plurality of the anode blocks is S, wherein S≥144 μm².

14. The display panel according to claim 1, wherein the anode has a quadrangle shape, and an angle α between an extension of at least one pair of sides of the anode and the row direction satisfies: 0°<α<90°.

15. The display panel according to claim 14, wherein 30°≤α≤70°.

16. The display panel according to claim 14, wherein the anode is diamond shaped.

17. The display panel according to claim 1, wherein the display panel is an organic light-emitting display panel.

18. A display device comprising:
a display panel, comprising:
a base substrate;
a plurality of gate lines extending in a row direction and a plurality of data lines extending in a column direction arranged on the base substrate, wherein the plurality of gate lines and the plurality of data lines intersect in an insulation manner to define a plurality of pixel circuit regions comprising a plurality of pixel circuits;
a plurality of sub-pixel regions arranged on the base substrate, wherein each of the plurality of sub-pixel regions comprises a light-emitting element, a corresponding one of the plurality of pixel circuits provides a driving signal to the light-emitting element, and the light-emitting element comprises an anode, a light-emitting layer and a cathode which are sequentially stacked at a side of the base substrate; and
a plurality of light-emitting control signal lines arranged on the base substrate, wherein the plurality of light-emitting control signal lines extends in the row direction and intersect with the plurality of data lines in an insulation manner;
wherein the anode does not overlap with the plurality of gate lines and/or the plurality of light-emitting control signal lines extending in the row direction.

19. A display device comprising:
a display panel, comprising:
a base substrate;
a plurality of gate lines extending in a row direction and a plurality of data lines extending in a column direction arranged on the base substrate, wherein the plurality of gate lines and the plurality of data lines intersect in an insulation manner to define a plurality of pixel circuit regions comprising a plurality of pixel circuits;
a plurality of sub-pixel regions arranged on the base substrate, wherein each of the plurality of sub-pixel regions comprises a light-emitting element, a corresponding one of the plurality of pixel circuits provides a driving signal to the light-emitting element, and the light-emitting element comprises an anode, a light-emitting layer and a cathode which are sequentially stacked at a side of the base substrate; and
a plurality of light-emitting control signal lines arranged on the base substrate, wherein the plurality of light-emitting control signal lines extends in the row direction and intersect with the plurality of data lines in an insulation manner;
wherein the anode does not overlap with the plurality of gate lines and/or the plurality of light-emitting control signal lines extending in the row direction;
wherein the display panel further comprises a plurality of power signal lines arranged on the base substrate,
wherein the plurality of power signal lines extends in the column direction and intersects with the plurality of gate lines in an insulation manner; and
the anode does not overlap with the plurality of data lines and/or the plurality of power signal lines extending in the column direction.

* * * * *